(12) United States Patent
Heo

(10) Patent No.: US 9,030,825 B2
(45) Date of Patent: May 12, 2015

(54) SPRINGY CLIP TYPE APPARATUS FOR FASTENING POWER SEMICONDUCTOR

(75) Inventor: Min Heo, Seoul (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 69 days.

(21) Appl. No.: 13/615,583

(22) Filed: Sep. 13, 2012

(65) Prior Publication Data
US 2013/0083486 A1 Apr. 4, 2013

(30) Foreign Application Priority Data
Oct. 4, 2011 (KR) .......... 10-2011-0100899

(51) Int. Cl.
H05K 7/20 (2006.01)
H01L 23/40 (2006.01)
H01L 23/473 (2006.01)

(52) U.S. Cl.
CPC ..... *H01L 23/4093* (2013.01); *H01L 2924/0002* (2013.01)

(58) Field of Classification Search
CPC ............... G06F 1/16–1/1654; G06F 1/1656; G06F 1/1662–1/1681; G06F 1/1684–1/189; G06F 1/20; G06F 1/203; G06F 1/206; G06F 2200/201; G06F 2200/202; G06F 2200/203; H05K 5/00; H05K 5/0026; H05K 5/0082; H05K 5/0021; H05K 5/0086–5/06; H05K 5/069; H05K 7/005–7/08; H05K 7/20; H05K 7/00; H05K 7/1422; H05K 1/0218–1/0219; H05K 1/00; H05K 3/00; H05K 9/00; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H01R 4/00; H01R 9/00; H01R 13/00; H01K 1/00; H01K 3/00; H02B 1/00; H01H 37/00
USPC ........ 361/679.46–679.54, 688–723; 165/80.1–80.3, 80.2–80.5, 104.33; 257/718–719; 174/15.1–15.2, 174/16.1–16.3; 24/453, 458–459
See application file for complete search history.

(56) References Cited

U.S. PATENT DOCUMENTS 4,890,196 A * 12/1989 Hinshaw ................. 361/709
4,923,179 A * 5/1990 Mikolajczak ........... 267/160

(Continued)

FOREIGN PATENT DOCUMENTS

CN 1809922 7/2006
CN 101364575 2/2009

(Continued)

OTHER PUBLICATIONS

Japan Patent Office Application Serial No. 2012-194819, Office Action dated Jan. 7, 2014, 3 pages.

(Continued)

*Primary Examiner* — Michail V Datskovskiy
*Assistant Examiner* — Razmeen Gafur
(74) *Attorney, Agent, or Firm* — Lee, Hong, Degerman, Kang & Waimey

(57) ABSTRACT

The present disclosure relates to an apparatus for fastening a power semiconductor using an integral springy (elastic) clip, capable of fixing a power semiconductor, such as a diode and a MOSFET, using elasticity of a U-shaped clip by integrally molding the clip onto a housing of a plastic module. The apparatus includes an elastic (springy) clip integrally molded onto a lower surface of the housing and downwardly curved into a U-like shape in a bridge module in which a bridge of the power semiconductor protrudes through a through hole of the housing to be connected to a printed circuit board, whereby the power semiconductor is fixed by a force that the housing presses the power semiconductor.

3 Claims, 6 Drawing Sheets

(56) References Cited

U.S. PATENT DOCUMENTS

| | | | |
|---|---|---|---|
| 5,130,888 A * | 7/1992 | Moore | 361/717 |
| 5,377,078 A * | 12/1994 | Kalis | 361/707 |
| 5,648,889 A * | 7/1997 | Bosli | 361/704 |
| 5,896,270 A * | 4/1999 | Tsui | 361/704 |
| 6,043,981 A * | 3/2000 | Markow et al. | 361/704 |
| 6,049,459 A * | 4/2000 | Edmonds et al. | 361/707 |
| 6,079,486 A * | 6/2000 | Cennamo et al. | 165/80.3 |
| 6,229,703 B1 * | 5/2001 | Lee | 361/704 |
| 6,392,887 B1 * | 5/2002 | Day et al. | 361/704 |
| 6,431,259 B2 * | 8/2002 | Hellbruck et al. | 165/80.3 |
| 6,465,728 B1 * | 10/2002 | McLaughlin et al. | 174/16.3 |
| 6,490,162 B2 * | 12/2002 | Siu | 361/719 |
| 6,587,344 B1 * | 7/2003 | Ross | 361/704 |
| 6,600,652 B2 * | 7/2003 | Chandran et al. | 361/704 |
| 6,816,375 B2 * | 11/2004 | Kalyandurg | 361/704 |
| 6,822,869 B2 * | 11/2004 | Huang et al. | 361/704 |
| 6,885,557 B2 * | 4/2005 | Unrein | 361/704 |
| 6,892,796 B1 * | 5/2005 | Nagashima et al. | 165/80.4 |
| 6,992,893 B2 * | 1/2006 | Miyamura et al. | 361/705 |
| 7,203,066 B2 * | 4/2007 | Lee et al. | 361/704 |
| 7,538,426 B2 * | 5/2009 | Yamabuchi et al. | 257/714 |
| 7,746,653 B2 * | 6/2010 | Negrut | 361/719 |
| 7,919,854 B2 * | 4/2011 | Stolze | 257/712 |
| 8,446,726 B2 * | 5/2013 | Schloerke et al. | 361/704 |
| 8,520,386 B2 * | 8/2013 | Bott et al. | 361/699 |
| 2001/0030037 A1 * | 10/2001 | Hellbruck et al. | 165/80.3 |
| 2004/0201964 A1 * | 10/2004 | Sigl et al. | 361/704 |
| 2008/0174968 A1 * | 7/2008 | Feng et al. | 361/720 |
| 2009/0021916 A1 * | 1/2009 | Stolze | 361/709 |
| 2009/0213553 A1 * | 8/2009 | Tschirbs et al. | 361/709 |
| 2010/0208427 A1 * | 8/2010 | Horiuchi et al. | 361/699 |
| 2011/0242760 A1 * | 10/2011 | Bott et al. | 361/699 |

FOREIGN PATENT DOCUMENTS

| | | |
|---|---|---|
| CN | 101552264 | 10/2009 |
| JP | 2009-043863 | 2/2009 |
| JP | 2010-114115 | 5/2010 |

OTHER PUBLICATIONS

The State Intellectual Property Office of the People's Republic of China Application Serial No. 201210337763.6 Office Action dated Dec. 3, 2014, 6 pages.

Japan Patent Office Application Serial No. 2012-194819, Office Action dated Jul. 15, 2014, 3 pages.

* cited by examiner

US 9,030,825 B2

SPRINGY CLIP TYPE APPARATUS FOR FASTENING POWER SEMICONDUCTOR

CROSS-REFERENCE TO RELATED APPLICATION

Pursuant to 35 U.S.C. §119(a), this application claims the benefit of earlier filing date and right of priority to Korean Application No. 10-2011-0100899, filed on Oct. 4, 2011, the contents of which is incorporated by reference in its entirety.

BACKGROUND OF THE INVENTION

1. Field of the Invention

This specification relates to an apparatus for integrally fixing (fastening) a power semiconductor to a heat sink when fabricating the power semiconductor, such as an inverter and a charger, as core components of an electric vehicle, integrally with a booth bar or the like, and particularly, to an apparatus for fastening a power semiconductor using an integral springy (elastic) clip, capable of fixing a power semiconductor, such as a diode and a MOSFET, using elasticity of a U-shaped clip by integrally molding the clip onto a housing of a plastic module.

2. Background of the Invention

In general, a power semiconductor module is utilized as a core semiconductor device for power conversion which converts a Direct-Current (DC) or Alternating-Current (AC) voltage or current into an appropriate form and size required by a system. The power semiconductor module is often applied to an industrial application field, such as an inverter, an uninterruptible power supply, a welder, an elevator and the like, and a vehicle field.

To overcome problems of heat sinks which are used by being fixed to the power semiconductor devices, the power semiconductor devices such as transistors and MOSFETs are fixed to the heat sinks by directly forming screw insertion holes at the heat sinks or shielding the semiconductor devices by aluminum bars, which are cut by each length, and fixing the aluminum bars to the heat sinks by screws. However, this causes a problem of forming unnecessary screw insertion holes at the heat sinks.

The related art employs a scheme in which the power semiconductor is assembled onto a Printed Circuit Board (PCB) in a soldering manner, and coupled to a heat sink for cooling in a bolting manner. For ensuring assembly efficiency in the scheme, holes are additionally formed at the PCB when the semiconductor is located outside or inside the PCB.

A fixing structure for a power semiconductor according to the related art will be described with reference to FIG. 1, which shows a configuration that the semiconductor is located outside the PCB.

Each of power semiconductor devices 100 is installed on a semiconductor installation portion 19 of a heat sink 18 in a contact state, and bridges 110 is connected to one side of a PCB 20 in a soldering manner. The PCB 20 is inserted into a PCB fixing recess 24 of the heat sink 10. A clip type fixing device 10, as shown in FIG. 1, is separately coupled to each power semiconductor device 100 in a pressing manner to be appropriate for a specific structure of the heat sink.

Referring to FIG. 2, even when a bridge module is employed to connect the power semiconductor to an electronic circuit via a housing, the power semiconductor 100 located below the housing has to be fixed at the outside by a separate fixing clip 60. Here, screws are inserted into fixing openings 133 formed through a semiconductor fixing piece 130 to fix the power semiconductor, and pressing pieces 65 of the fixing clip 60 which is a steel clip elastically fix the power semiconductor. Also, screws inserted into clip fixing openings 67 may be separately used to fix the fixing clip 60.

Here, for a semiconductor with a small capacity, plastic screws are used. However, this has a disadvantage of being vulnerable to heat-resistance. Also, the fixing clip 60 completely covers the semiconductor, which additionally requires a hole for allowing a tool such as a driver to be inserted. This may result in a limitation of a circuit design.

In the related art as shown in FIGS. 1 and 2, the semiconductor is located outside the PCB to couple screws for fixing the semiconductor. Or, if such structure is impossible, a hole for allowing a tool such as a driver or the like to be inserted is required. This lowers a degree of freedom in view of designing patterns of the PCB due to the position limit. In addition, bolts are required for fixing the clip, thereby increasing the number of components.

Furthermore, as aforementioned, the plastic screws are used for fixing the small semiconductor. Accordingly, such screws may be deformed due to heat generation of the semiconductor and thereby a fixing force may be weakened or lost.

SUMMARY OF THE INVENTION

Therefore, to overcome the drawbacks of the related art, an aspect of the detailed description is to provide an integral clip type module for fixing a power semiconductor, capable of improving assembly efficiency and reducing a limit on a PCB pattern design by integrally mounting an elastic (springy) clip onto a lower surface of a housing of a plastic module to fix a semiconductor such as a diode and a MOSFET using elasticity of the clip.

Another aspect of the detailed description is to solve problems, such as deformation, lowered fixing force and loss of screws due to heat generation of a semiconductor, by reduction of the number of required components, such as separate screws and bolts for fixing a fixing clip, and without use of a plastic screw.

To achieve these and other advantages and in accordance with the purpose of this specification, as embodied and broadly described herein, there is provided a an apparatus for fixing (fastening) a power semiconductor to a heat sink including a power semiconductor used for an inverter and a charger for an electric vehicle, a housing fixed onto a heat sink together with the power semiconductor and having a Printed Circuit Board (PCB), which is disposed on the housing, has electronic circuits thereon, such as the inverter, the charger and the like, and is connected to a bridge of the power semiconductor, which is located below the housing, via a through hole, and an elastic clip integrally mounted onto the lower surface of the housing to elastically press the lower power semiconductor so as to be fixed onto the heat sink.

In accordance with another exemplary embodiment, the elastic clip may include a plurality of U-shaped concave portions, which extends in a widthwise direction of a steel plate so as to form a plurality of pressing pieces, and a flat portion of the steel plate may form a molding portion integrally molded onto the housing.

As described above, the present disclosure may have the following effects in the aspects of the best mode, configuration and assembling to be explained later and an operational relation.

The present disclosure may not need a separate screw for fixing a semiconductor but integrally mount an elastic clip onto a lower surface of a housing of a plastic module so as to fixe the semiconductor, such as a diode and a MOSFET using elasticity of the clip, which may result in improvement of assembling efficiency and reduction of a limit on a pattern design of a printed circuit board.

Also, the number of required components, such as screws and bolts for fixing the clip may be reduced, thereby obtaining economical efficiency.

In addition, without use of screws made of plastic, concerns about deformation, lowered fixing force and loss of screws due to heat generation of the semiconductor may be avoided, an assembling operation may be facilitated, and a degree of freedom for an installation position of the semiconductor may be enhanced.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Figure 1:
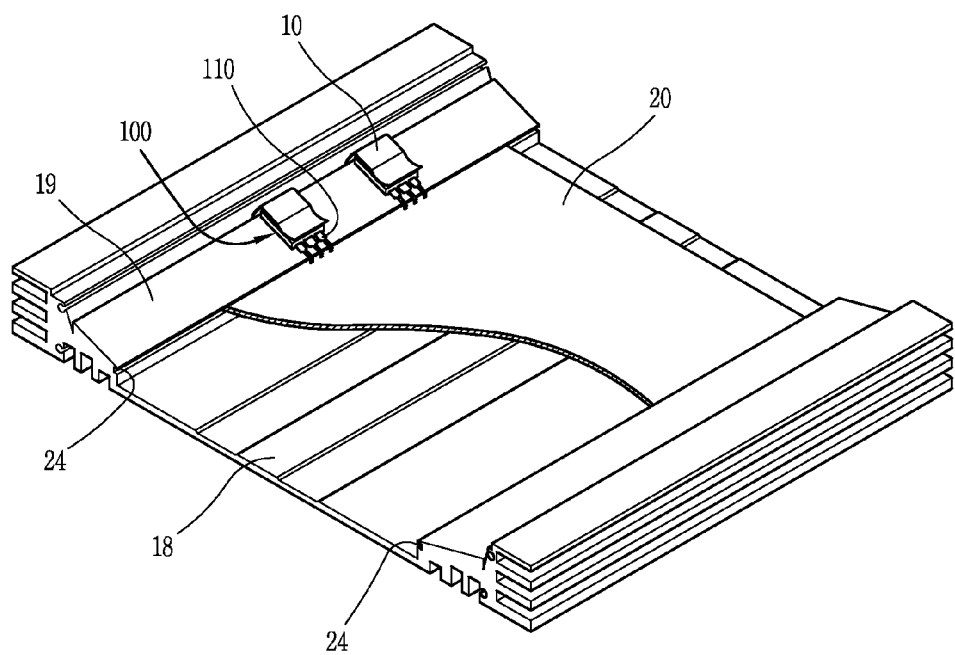
FIG. 1 is a view showing an apparatus for fixing a power semiconductor to a heat sink according to the related art.

Description will now be given in detail of an integral clip type module for fixing a power semiconductor according to the exemplary embodiments, with reference to the accompanying drawings.

Technical terms used in this specification are used to merely illustrate specific embodiments, and should be understood that they are not intended to limit the present disclosure. As far as not being defined differently, all terms used herein including technical or scientific terms may have the same meaning as those generally understood by an ordinary person skilled in the art to which the present disclosure belongs, and should not be construed in an excessively comprehensive meaning or an excessively restricted meaning.

The preferred exemplary embodiments for the configurations described in the detailed description and the figures are merely illustrative without entirely representing the technical scope of the present disclosure. Therefore, it should be understood that there are various equivalents and variations to replace them at the time of filing this application.

Hereinafter, the configuration of the present disclosure and the preferred exemplary embodiment will be described in detail with reference to FIGS. 3 to 6.

An apparatus for fixing (fastening) a power semiconductor onto a heat sink may include a power semiconductor 100 used for an inverter and a charger for an electric vehicle, a housing 200 fixed onto a heat sink together with the power semiconductor 100 and having a Printed Circuit Board (PCB), which is disposed on the housing, has electronic circuits thereon, such as the inverter, the charger and the like, and is connected to a bridge 110 of the power semiconductor 100, which is located below the housing 200, via a through hole 230, and an elastic clip 300 integrally mounted onto the lower surface of the housing 200 to elastically press the lower power semiconductor so as to be fixed onto the heat sink.

Figure 3:
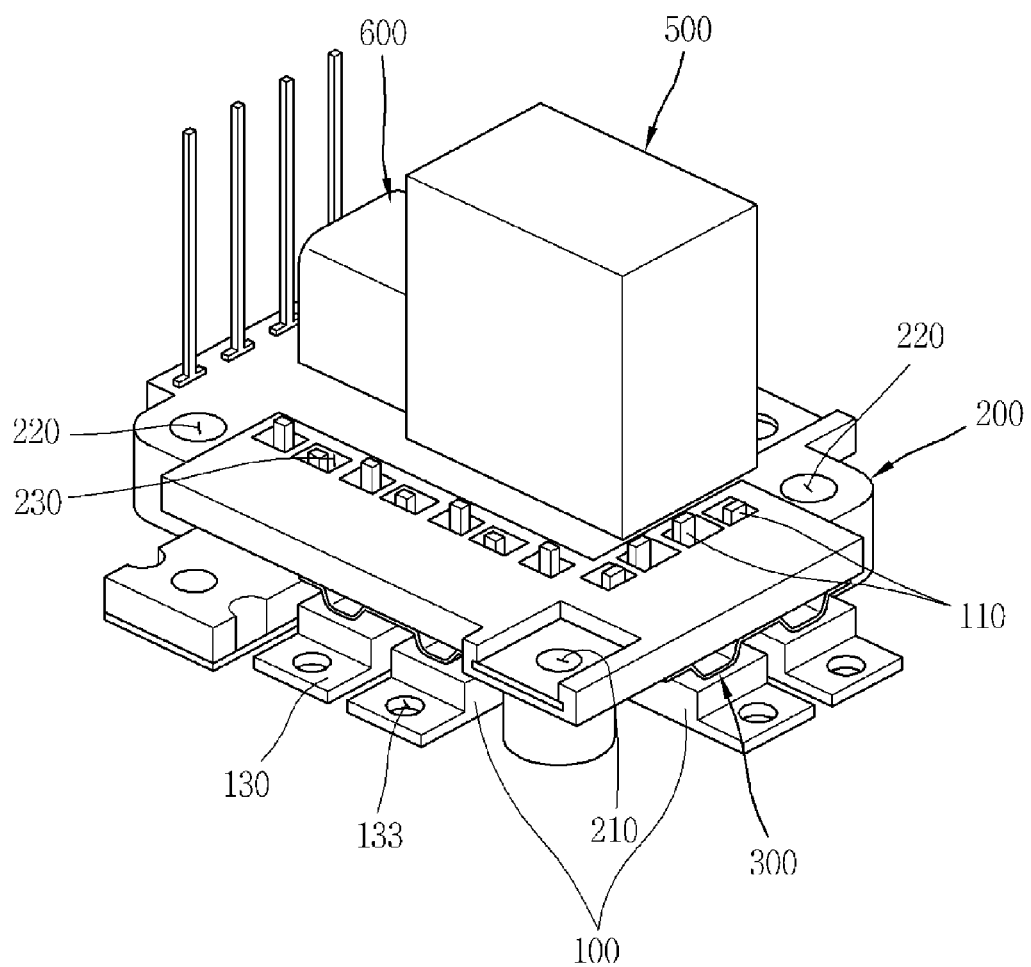
FIG. 3 is a view showing a fixing manner of a power semiconductor onto a bridge module in accordance with the present disclosure.

Referring to FIG. 3, the power semiconductor 100 is located below the housing 200 and a heat sink (not shown) may be located below the power semiconductor 100. The power semiconductor bridge 110 may upwardly protrude through the housing 200 via the through hole 230, which is formed through the housing 200. The bridge 110 may connect the power semiconductor 100 to a PCB (not shown) included in the inverter, the charger or the like, located thereon.

A scheme for connecting such type of full bridge module to the heat sink is employed from a typical connecting method for the inverter and the charger. Thus, detailed description of the scheme will be omitted.

The fixing method of the power semiconductor using the elastic clip may be applied to a molding package, such as a Power Factor Corrector (PFC) module and a full bridge module.

Still referring to FIG. 3, the fixing method using the power semiconductor fixing apparatus may be implemented such that the power semiconductor 100 located below the housing 200 is fixed onto the heat sink located therebelow in a contact state. Accordingly, the power semiconductor 100 may include a fixing element 130 protruding to one side thereof to be fixed onto the heat sink, and be integrally fixed onto the lower heat sink via a fixing opening 133 of the fixing element 130.

The housing 200, which fixes the power semiconductor 100 with downwardly pressing it, may include a housing fixing opening 210 by which the housing 200 is fixed onto the heat sink.

Figure 4:
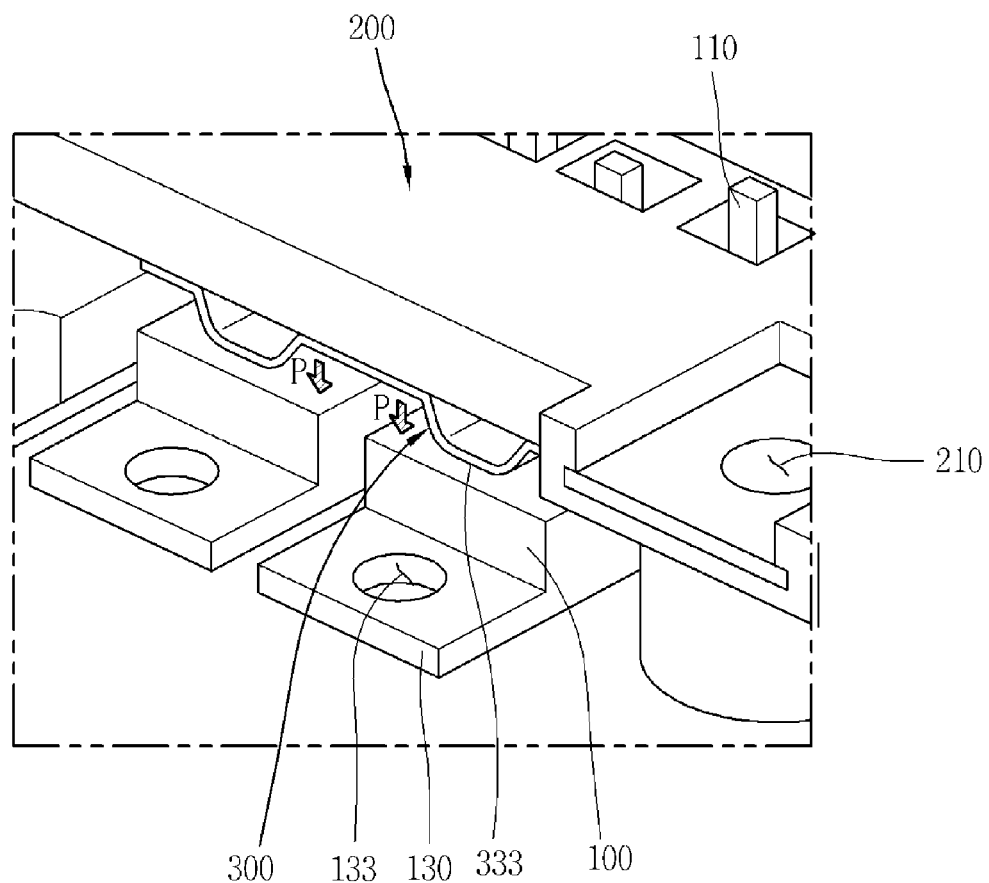
FIG. 4 is a view showing an operation of fixing a power semiconductor device using an elastic (springy) clip in accordance with the present disclosure.

Referring to FIGS. 3 and 4, the apparatus according to the present invention may include the elastic clip 300 for fixing the power semiconductor 100 onto the heat sink with elastically pressing the power semiconductor 100. The elastic clip 100 may be located between the housing 200 and the power semiconductor 100 and integrally attached onto the lower surface of the housing 200.

Figure 2:
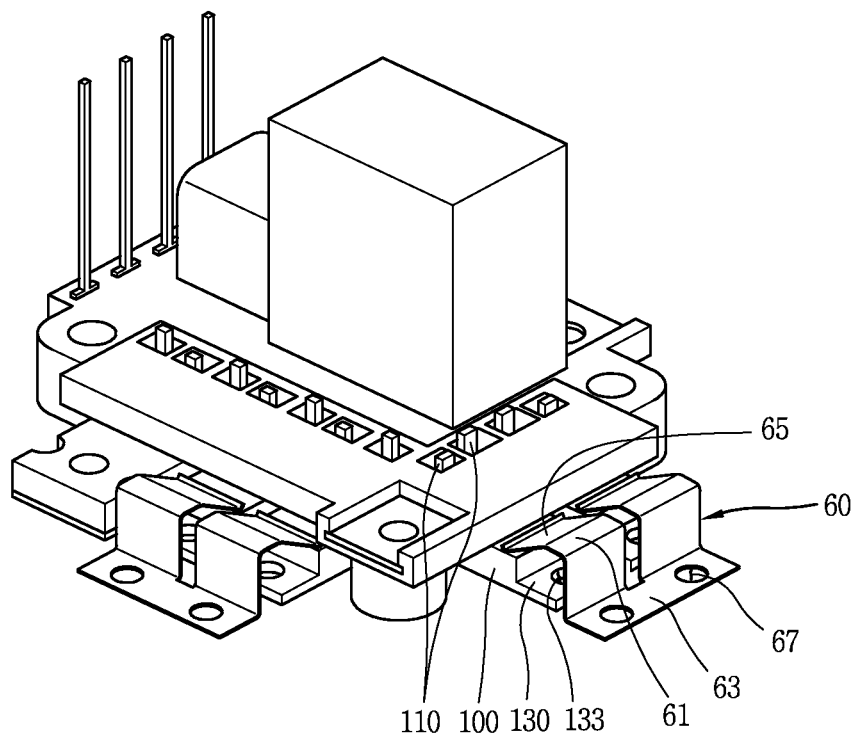
FIG. 2 is a view showing a fixing manner of a power semiconductor onto a bridge module according to the related art.

With the elastic clip 300 integrally attached onto the lower surface of the housing 200, a separate clip may not need to fix the power semiconductor 100 at the outside, as shown in the related art with reference to FIG. 2. Therefore, the fixing device 130 of the power semiconductor 100 may not be obscured. This allows for ensuring a sufficient working space and facilitates adjustment of a position of the semiconductor, resulting in enhancement of working efficiency.

FIG. 4 is a view showing an operation of fixing the lower power semiconductor 100 by pressing it with the elastic clip 300 formed on the lower surface of the housing 200. And, FIG. 5 shows a shape of the elastic clip 300 and coupling of the elastic clip 300 onto the lower surface of the housing 200.

Figure 5:
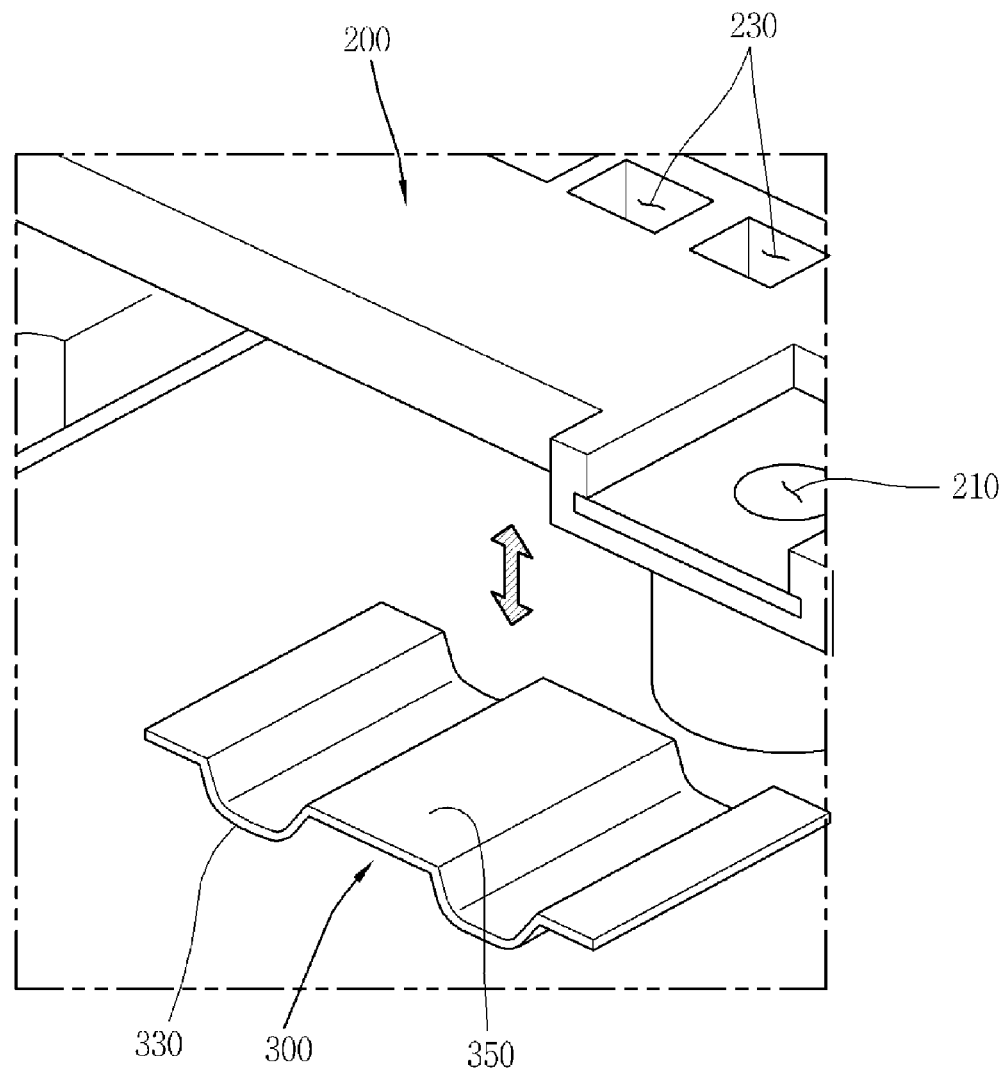
FIG. 5 is a view showing a molded relation between a housing and the elastic clip.

Referring to FIGS. 4 and 5, the elastic clip 300 may be formed of a steel plate having concave portions curved downwardly. Such elastic clip 300 may be integrally coupled to the lower surface of the housing 200.

Although not shown, as another example, the elastic clip 300 may be formed of a steel plate or a plastic panel, which has wavy convex-concave shapes in a widthwise direction. Here, convex portions may be integrally coupled onto the housing 200 by an adhesive agent or molded onto the housing 200. The concave portions may form pressing pieces 330 for fixedly pressing the lower power semiconductor 100.

Referring to FIG. 5, the elastic clip 300 may have concave portions concaved in a widthwise direction on a steel plate or plastic panel which has a flat surface. The concave portion may implement the pressing piece 330. The flat portion may form a molding portion 350 integrally coupled onto the lower surface of the housing 200.

The pressing pieces 330 of the elastic clip 300 are a plurality of U-shaped concave portions extending in the widthwise direction of the steel plate and may be installed on a plurality of positions, especially, on positions corresponding to positions of the power semiconductors 100 fixed onto the lower surface of the elastic clip 300. The flat portion of the steel plate may be formed as the molding portion 350, which is integrally molded onto the housing or integrally coupled onto the housing by means of an adhesive agent.

Still referring to FIG. 5, the elastic clip 300 may be preferably integrally installed onto the lower surface of the plastic housing 200 in a molding manner. Alternatively, the elastic clip 300 may be integrally installed by use of the adhesive agent.

Figure 6:
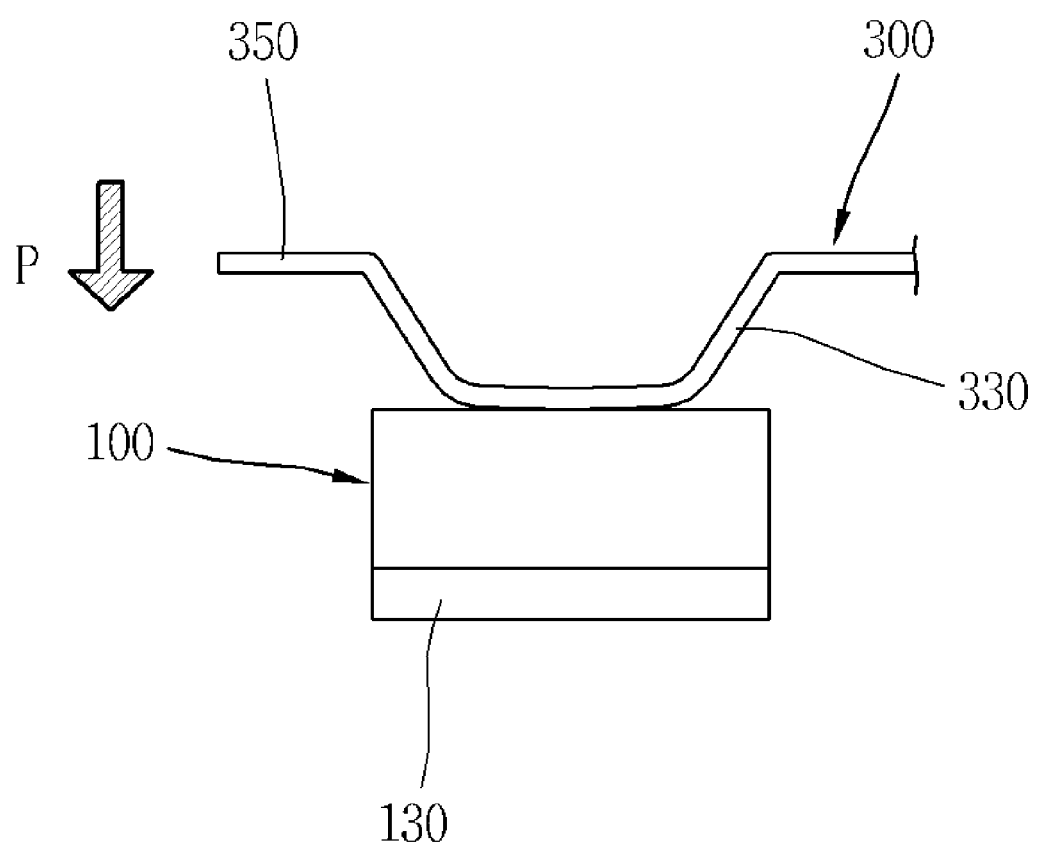
FIG. 6 is a view showing that the elastic clip fixes the power semiconductor with pressing the power semiconductor in accordance with the present disclosure.

FIG. 6 is an elevation view showing that the pressing piece 330 of the elastic clip 300 fixes the power semiconductor 100 by downwardly pressing the power semiconductor 100. Here, when the housing 200 is fixed onto the heat sink via the fixing opening 210, a force P is downwardly applied onto the housing 200. The pressing piece 330 of the elastic clip 300 is then closely adhered onto the power semiconductor 100 such that the power semiconductor 100 is fixed onto the heat sink. This may allow for designing a package type full bridge module even without a separate power semiconductor fixing apparatus.

That is, upon assembling the full bridge module onto the heat sink, the power semiconductor 100 is closely adhered onto the heat sink with being pressed by the elastic clip 300 located on the power semiconductor 100. This structure may allow the power semiconductor device to be assembled onto the heat sink in the closely adhered state without a separate coupling element such as screws or the like. Accordingly, the number of components such as bolts or the like may be reduced so as to reduce a fabricating cost and the assembling operation may be facilitated. In addition, when plastic coupling bolts are used, deformation of the bolts or a loss of fixing force may be caused due to heat generation by the semiconductor. However, such problems can be overcome.

Also, enhancement of the degree of freedom for the installation position of the semiconductor may result in overcoming a position limit, thereby enhancing a degree of freedom for a pattern design for the PCB.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. An elastic clip for an apparatus to press a power semiconductor device to a preset place, the apparatus comprising a housing fixed to a heat sink, the heat sink having a Printed Circuit Board (PCB) and is in contact with the power semiconductor device, the elastic clip mounted between a lower surface of the housing and the power semiconductor device and comprising:
    at least one flat plate each having a predetermined rectangular area and integrally molded on the lower surface of the housing;
    a pair of connecting arms extending slantwise and downward from two opposite ends of each of the at least one flat plate; and
    a pair of pressing portions extending horizontally and outward from free ends of each of the pair of connecting arms,
    wherein each of the pair of pressing portions is elastically deformable in response to a load applied by the housing to the corresponding at least one flat plate in order to press the semiconductor device.

2. The apparatus of claim 1, wherein:
each of the at least one flat plate is formed of steel.

3. The apparatus of claim 1, wherein a whole body of the elastic clip is located between the housing and the power semiconductor device.

* * * * *